United States Patent
Gernhard et al.

(10) Patent No.: US 6,548,850 B1
(45) Date of Patent: Apr. 15, 2003

(54) TRENCH CAPACITOR CONFIGURATION AND METHOD OF PRODUCING IT

(75) Inventors: Stefan Gernhard, Mechnicsville, VA (US); Martin Schrems, Langebrück (DE); Klaus-Dieter Morhard, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/677,324

(22) Filed: Sep. 29, 2000

(51) Int. Cl.$^7$ ............................................. H01L 27/108
(52) U.S. Cl. ....................... 257/301; 257/296
(58) Field of Search ................................ 257/296, 301, 257/302, 303, 304, 305, 311

(56) References Cited

U.S. PATENT DOCUMENTS

| | | |
|---|---|---|
| 4,937,205 A | 6/1990 | Nakayama et al. |
| 5,247,198 A * | 9/1993 | Homma et al. |
| 5,250,829 A | 10/1993 | Bronner et al. |
| 5,344,381 A | 9/1994 | Cabrera y Lopez Caram |
| 5,360,758 A | 11/1994 | Bronner et al. |
| 5,419,805 A * | 5/1995 | Jolly |
| 5,658,818 A * | 8/1997 | Akram et al. |
| 5,859,451 A * | 1/1999 | Narita |
| 5,866,453 A * | 2/1999 | Prall et al. |
| 5,867,420 A | 2/1999 | Alsmeier |
| 6,008,104 A * | 12/1999 | Schrems |

FOREIGN PATENT DOCUMENTS

EP 0 621 632 A1 10/1994

OTHER PUBLICATIONS

Frank S. Becker et al.: "Low Pressure Deposition of Doped $SiO_2$ by Pyrolysis of tetraethylorthosilicate (TEOS)", Journal of the Electrochemical Society, vol. 136, No. 10, Oct. 1989, pp. 3033–3043.

C.M. Ransom et al.: "Shallow $n^+$ Junctions in Silicon by Arsenic Gas–Phase Doping", Journal of the Electrochemical Society, vol. 141, No. 5, May 1994, pp. 1378–1381.

* cited by examiner

Primary Examiner—Nathan J. Flynn
Assistant Examiner—Keith Quinto
(74) Attorney, Agent, or Firm—Laurence A. Greenberg; Werner H. Stemer; Ralph E. Locher

(57) ABSTRACT

A trench capacitor is formed in a substrate and includes a trench having an upper region and a lower region. An insulating collar is formed in the upper region of the trench. The lower region of the trench extends through a buried well. A buried plate is formed around the lower region of the trench as an outer capacitor electrode. A dielectric layer, which forms the capacitor dielectric, lines the lower region of the trench and the insulating collar. A conductive trench filling is put into the trench. A conductive contact layer of tungsten nitride is provided above the insulating collar, between the substrate and the conductive trench filling, and acts as a diffusion barrier. This makes it possible to provide the trench capacitor more closely to the transistor, since the transistor is not damaged by material which is contained in the conductive trench filling.

18 Claims, 9 Drawing Sheets

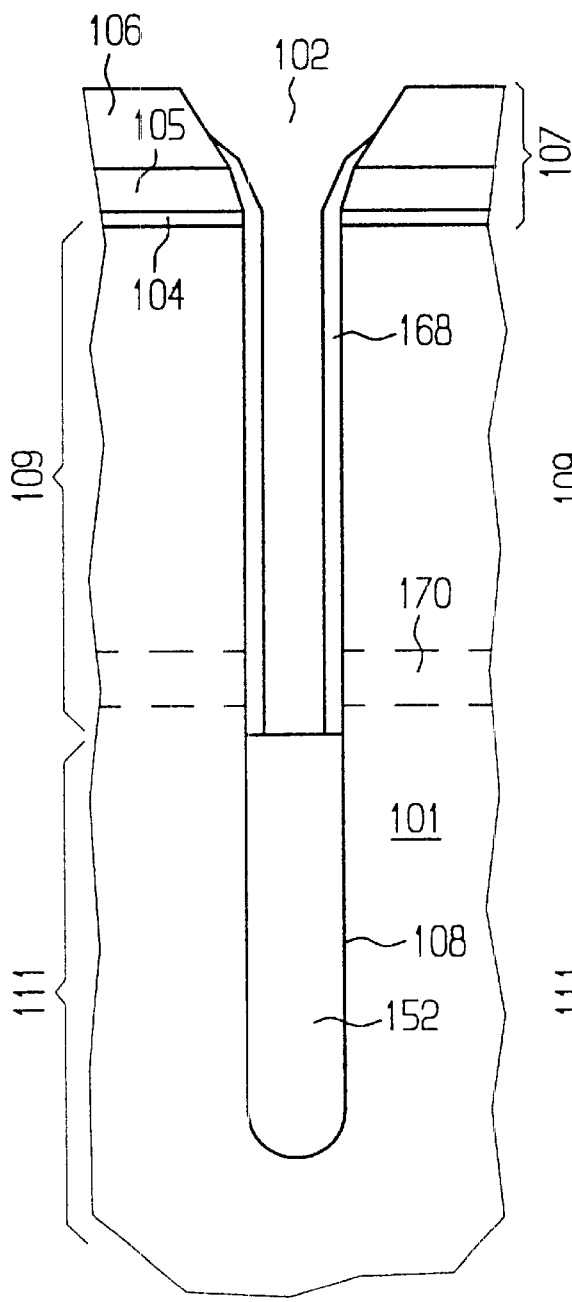
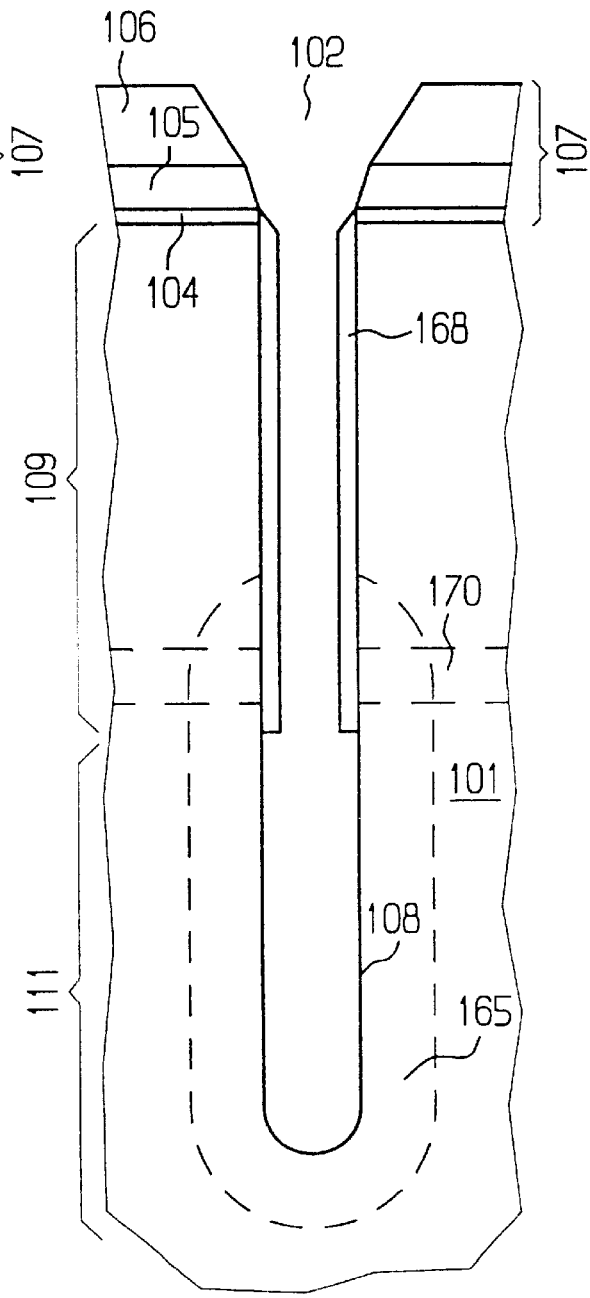

FIG 4F
FIG 4G
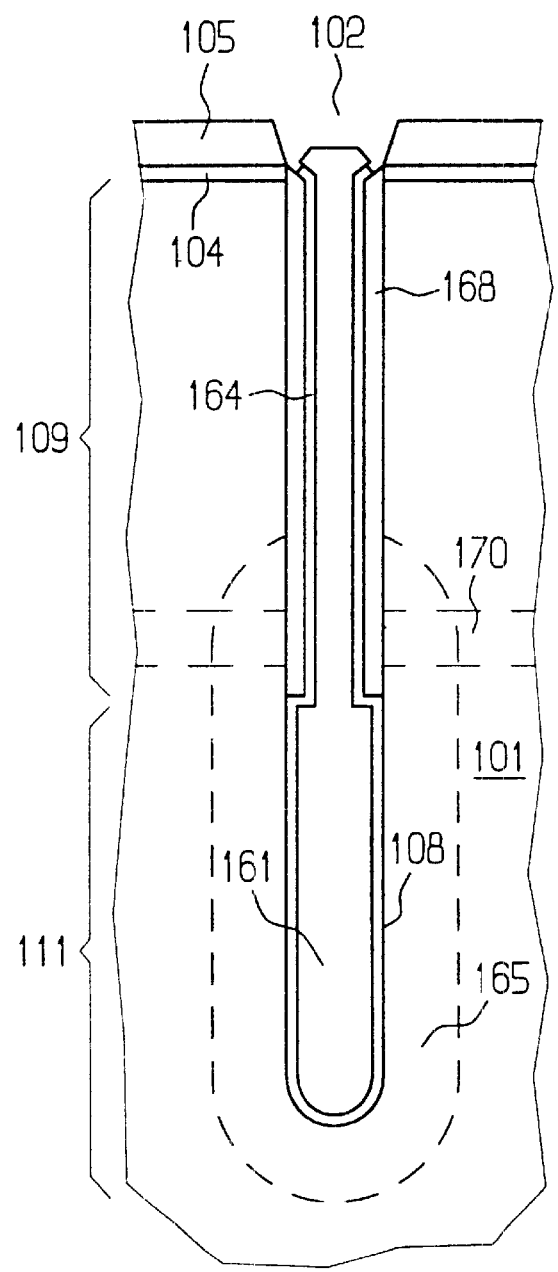
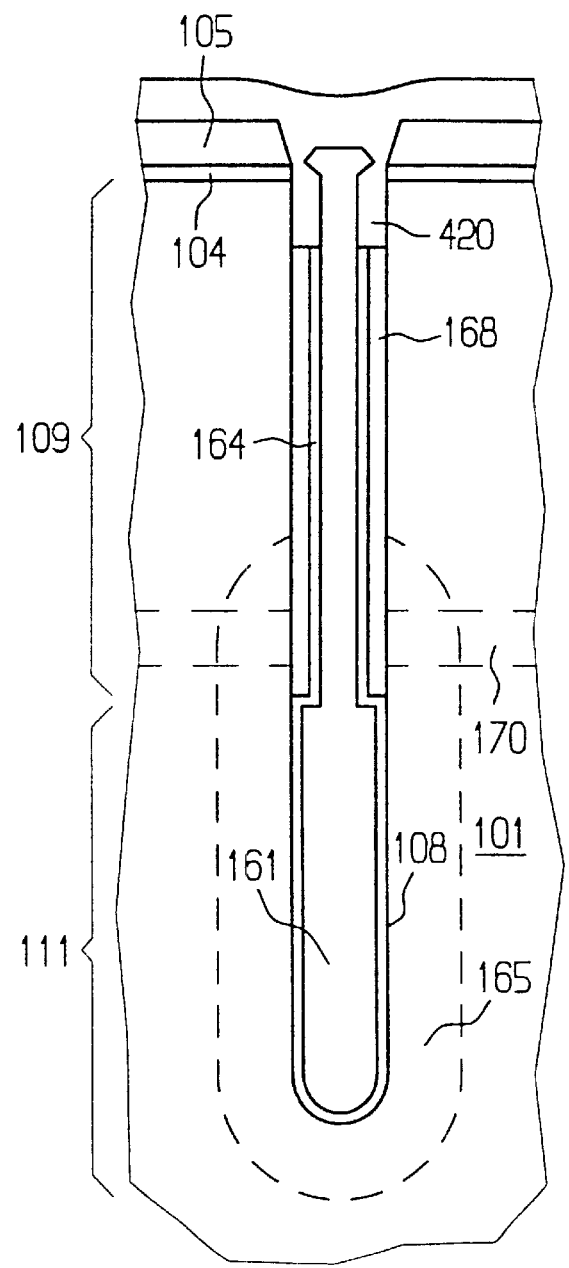

FIG 6A
FIG 6B
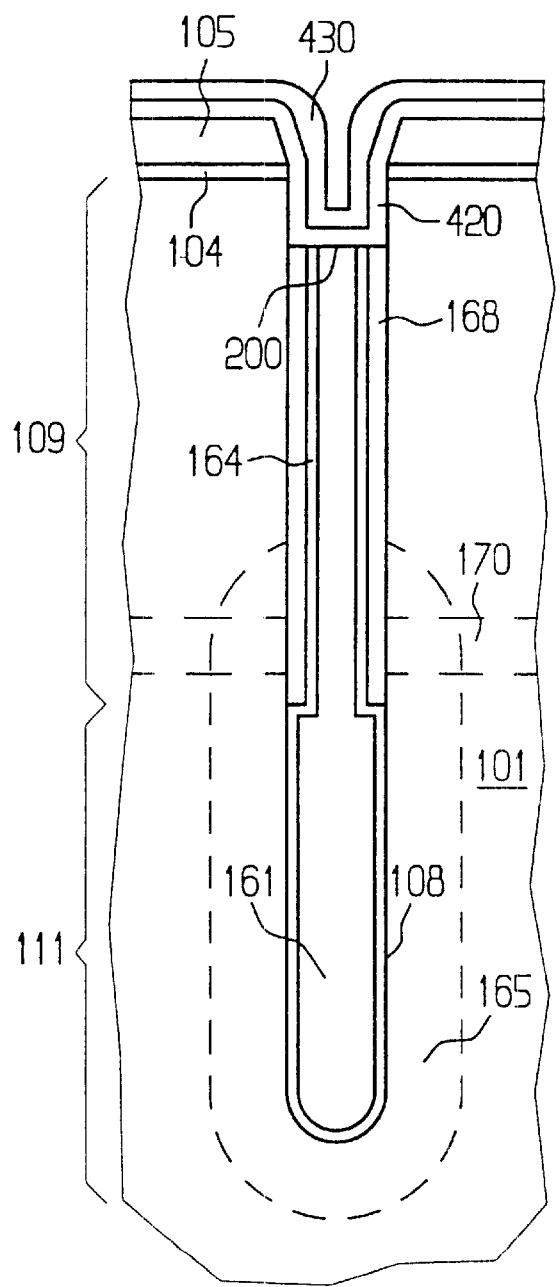
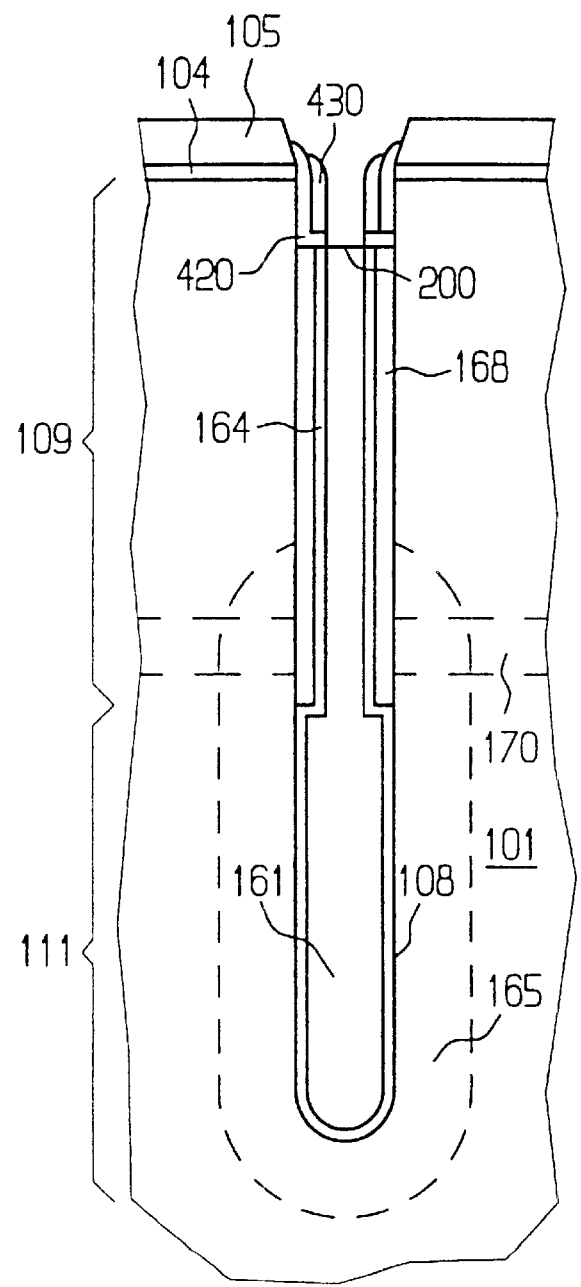

TRENCH CAPACITOR CONFIGURATION AND METHOD OF PRODUCING IT

BACKGROUND OF THE INVENTION

Field of the Invention

The invention relates to a configuration having a trench capacitor and to a corresponding method of producing the configuration.

Integrated circuits (ICs) or chips use capacitors for the purpose of storing charges, such as a dynamic read/write memory with random access (DRAM). In this case, the charging state in the capacitor represents a data bit.

A DRAM chip contains a matrix of memory cells, which are provided in the form of rows and columns and are activated by word lines and bit lines. Reading data out of the memory cells, or writing data into the memory cells, is brought about by activating suitable word lines and bit lines.

A DRAM memory cell usually contains a transistor connected to a capacitor. The transistor contains two diffusion regions which are separated from each other by a channel which is controlled by a gate. Depending on the direction of the current flow, one diffusion region is referred to as the drain and the other as the source. The drain region is connected to the bit line, the source region is connected to the trench capacitor, and the gate is connected to the word line. By applying suitable voltages to the gate, the transistor is controlled in such a way that a current flow between the drain region and the source region through the channel is switched on and off.

The charge stored in the capacitor decays over time because of leakage currents. Before the charge has decayed to an indeterminate level below a threshold value, the storage capacitor must be refreshed. For this reason, these memory cells are referred to as dynamic RAM (DRAM). U.S. Pat. No. 5,867,420 discloses such a DRAM.

The central problem in the case of the known DRAM variants is the production of a sufficiently high capacitance in the trench capacitor. This problem will be intensified in the future as a result of the progressive miniaturization of semiconductor components. The continuous increase in the integration density means that the area available for each memory cell, and therefore the capacitance of the trench capacitor, will decrease more and more. Too low a capacitance of the trench capacitor can influence the functional capacity and usability of the memory device, since too low a quantity of charge is stored on it.

For example, read amplifiers need an adequate signal level to read out reliably the information stored in the memory cell. The ratio between the storage capacitance and the bit-line capacitance is decisive when determining the signal level. If the storage capacitance is too small, this relationship may be too small to produce an adequate signal.

Likewise, a low storage capacitance requires a higher refresh frequency, since the quantity of charge stored in the trench capacitor is limited by its capacitance and also decreases as a result of leakage currents. If the quantity of charge stored in the memory capacitor falls below a minimum, then it is no longer possible to read out the information stored in it by using the connected read amplifiers, the information is lost and read errors occur.

In order to avoid read errors, leakage currents should be low. On the one hand, leakage currents through transistors, and on the other hand leakage currents through dielectrics, such as the capacitor dielectric, can be reduced. Through the use of these measures, an undesirably reduced retention time can be prolonged.

In DRAMs, a trench capacitor is normally used. A trench capacitor has a three-dimensional structure, which is formed in a silicon substrate. An increase in the capacitor electrode area, and therefore in the capacitance of the trench capacitor, can be achieved by etching more deeply into the substrate. In this case, the increase in the capacitance of the trench capacitor does not enlarge the substrate surface taken up by the memory cell. However, this method is also restricted, since the achievable etching depth of the trench capacitor depends on the trench diameter, and only specific, finite aspect ratios can be achieved during production.

Given a progressive increase in the integration density, the substrate surface available for each memory cell decreases more and more. The associated reduction in the trench diameter necessarily leads to a reduction in the capacitance of the trench capacitor. If the capacitance of the trench capacitor is so low that the charge which can be stored is not adequate to be read out satisfactorily with the read amplifiers connected downstream, this results in read errors.

U.S. Pat. No. 5,360,758 discloses that in the case of memory cells with a trench capacitor and a transistor, a minimum spacing between the trench capacitor and the transistor must be maintained. This is required since, if there are temperature steps, the electrical contact between the trench capacitor and the transistor is produced by outward diffusion of a dopant, which is originally located in the trench capacitor. The outward diffusion of the dopant typically extends over distances which are greater than 100 nanometers. In this case, it must be ensured that the dopant does not diffuse into the channel of the transistor and consequently lead to increased leakage currents through the transistor and make the relevant memory cell unusable. This means that a memory cell which is theoretically possible without outward diffusion has to be enlarged by the magnitude of the outward diffusion.

SUMMARY OF THE INVENTION

It is accordingly an object of the invention to provide a trench capacitor configuration and a method of producing it which overcome the above-mentioned disadvantages of the heretofore-known configurations and methods of this general type and which provide an increased capacitance of the trench capacitor while maintaining the surface of the substrate, which is used by a memory cell, constant.

With the foregoing and other objects in view there is provided, in accordance with the invention, a trench capacitor configuration, including:
   a substrate formed with a trench;
   the trench having an upper region and a lower region;
   an insulating collar formed in the upper region;
   a buried well disposed in the substrate, the lower region at least partly extending through the buried well;
   a buried plate formed around the lower region and serving as an outer capacitor electrode;
   a dielectric layer lining the lower region and the insulating collar, the dielectric layer serving as a capacitor dielectric;
   a conductive trench filling disposed in the trench; and
   a conductive contact layer including at least one material selected from tungsten nitride, titanium nitride, and tantalum nitride, the conductive contact layer being disposed, between the substrate and the conductive trench filling, in the trench above the insulating collar.

The present invention is based on the idea of enlarging the trench 108 in the direction of the transistor 110 whilst keeping the substrate surface, which is used by the memory cell 100, constant. As a result, the proportion of the trench capacitor 160 on the substrate surface used is increased, and its capacitance increases. This is made possible by using a conductive contact layer 420, which serves as a diffusion barrier. In conventional trench capacitors, this diffusion barrier is not produced from tungsten nitride, and the electrical connection between the trench capacitor 160 and the transistor 110 is produced by the outward diffusion of dopants from a conductive trench filling 161 in order to form a buried contact 250. The diffusion barrier prevents the outward diffusion of materials, such as dopants or metals, which are contained in the trench filling 161 into the substrate 101, so that the transistor 110 is protected against the materials from the conductive trench filling 161 and maintains its advantageous characteristics. In this case, the connection between the trench capacitor and the transistor is produced by the conductive contact layer 420. The conductive contact layer 420 ensures a low-resistance connection to the conductive trench filling 161 and to the source region 114 and/or to an additionally introduced, buried contact 250. As a result, the spacing between the trench capacitor and the transistor can be reduced. In addition, while maintaining the lithographic dimension and the substrate surface used by the memory cell, the trench capacitor can be enlarged in the direction of the transistor.

A preferred embodiment of the invention provides for the conductive contact layer 420 to be provided in the trench 108 as a buried web on a side wall of the trench 108.

In an advantageous embodiment of the invention, there is in the trench 108, above the conductive trench filling 161, a buried bridge 162, which permits improved process control during the production of the buried contact 250, since by sinking the conductive trench filling 161, using an etching process with end-point monitoring, the sinking depth can be determined better. In this embodiment, the sunk, conductive trench filling 161, together with the buried bridge 162, constitutes the conductive trench filling.

In a further advantageous embodiment of the invention, a transistor 110 with a source region 114 is provided beside the trench capacitor, and the source region 114 reaches as far as the conductive contact layer 420. As a result, a low-resistance connection between the transistor 110 and the conductive contact layer 420, and hence the conductive trench filling 161 or the buried bridge 162 is achieved.

In a further advantageous embodiment of the invention, there is in the substrate 101, underneath a substrate surface 400, the buried contact 250, which reaches as far as the conductive contact layer 420, so that the buried contact 250 advantageously connects the buried bridge 162 and the trench filling 161 electrically to the source region 114 of the transistor 110. In order to form the buried contact 250, a dopant material can be introduced through the use of vertical or oblique implantation, through the use of plasma doping or through the use of gas-phase doping, through the substrate surface 400.

In a further advantageous embodiment of the invention, an additional lateral insulating web 410 is fitted to a side wall of the gate of a transistor, in order to protect the transistor from the dopant which is used to form the buried contact 250.

In a further advantageous embodiment of the invention, the conductive contact layer 420 is a diffusion barrier for a material which is contained in the conductive trench filling 161 and/or in the conductive buried bridge 162. As a result, the transistor 110 is protected against materials which can have a negative influence on its function.

According to another feature of the invention, the conductive contact layer 420 produces an electrically conductive connection between the buried contact 250 or the source region 114 and the conductive trench filling 161 or the conductive buried bridge 162.

In a further advantageous embodiment of the invention, a trench insulator 180 (STI), which has an insulating area 181, is applied in such a way that the trench 108 is at least partly covered by the insulating area 181. As a result, the passing word line 120' is insulated from the conductive buried bridge 162 or, respectively, the conductive trench filling 161 which forms the inner capacitor electrode.

A further advantageous embodiment of the invention provides for the conductive contact layer 420 to be made of tungsten nitride WN, titanium nitride TiN or tantalum nitride TaN. With the objects of the invention in view there is also provided, a method of producing a trench capacitor configuration, the method includes the steps of:

introducing a buried well into a substrate;
forming a trench with an upper region and a lower region in the substrate;
forming an insulating collar in the upper region;
forming, at the lower region, a buried plate in the substrate for providing an outer capacitor electrode;
lining the lower region and an inner side of the insulating collar with a dielectric layer for providing a capacitor dielectric;
filling the trench with a conductive trench filling for providing an inner capacitor electrode; and
forming a conductive contact layer of tungsten nitride above the insulating collar.

In accordance with another mode of the invention, the conductive contact layer is formed on a side wall of the trench.

In accordance with yet another mode of the invention, a covering layer is applied onto the conductive contact layer.

In accordance with a further mode of the invention, a conductive buried bridge is formed in the trench above the conductive trench filling, such that the conductive buried bridge forms an electrical contact between the conductive trench filling and the conductive contact layer.

In accordance with another mode of the invention, a transistor is provided adjacent to the trench and a lateral insulating web is formed on a gate of the transistor.

In accordance with yet another mode of the invention, a dopant is introduced through a surface of the substrate.

In accordance with a further mode of the invention, a buried contact is formed with the step of introducing the dopant.

In accordance with another mode of the invention, a trench insulator with an insulating region is formed and a lower edge of the insulating region is provided above a lower boundary of the buried contact.

In accordance with a further mode of the invention, the insulating collar and the dielectric layer are removed in the upper region of the trench between the substrate and the conductive trench filling for forming an annular trench region; and the annular trench region is filled with the conductive contact layer.

In accordance with another mode of the invention, the conductive trench filling, the insulating collar and the dielectric layer are at least partially removed, in other words they are sunk into the trench, for exposing the substrate on a side wall of the trench; and the conductive contact layer is formed as a lateral edge web on the side wall of the trench by using a conformal layer deposition step and a subsequent etch-back step.

In accordance with yet another mode of the invention, a covering layer is conformally deposited on the contact layer prior to the etch-back step; and the contact layer with a broadened base at a lower end thereof is formed during the etch-back step.

An advantageous embodiment of the production method forms a trench insulator 180 with an insulating area 181, the lower edge 182 of the insulating area 181 being formed above the lower limit 251 of the buried contact 250.

A further advantageous embodiment of the method according to the invention forms a lateral insulating web 410 on a gate 112. The lateral insulating web 410 serves as a mask for the introduction of dopant through the substrate surface 400, whereby a buried contact 250 is formed.

Other features which are considered as characteristic for the invention are set forth in the appended claims.

Although the invention is illustrated and described herein as embodied in a configuration having a trench capacitor, and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4a to g are diagrammatic, partial sectional views of trench capacitor configurations illustrating a first embodiment of the method according to the invention for producing the DRAM memory cell according to FIG. 1;

FIGS. 6a and b are diagrammatic, partial sectional views of yet a further embodiment of a DRAM memory cell configuration according to the invention for producing the DRAM memory cell according to FIG. 2.

DESCRIPTION OF THE PREFERRED EMBODIMENTS

Although the invention can be used for any type of trench capacitors, the present invention will be explained with reference to a trench capacitor used in a DRAM memory cell. For the sake of simplicity, the invention will be described with regard to the formation of a single memory cell. In the figures, identical reference symbols designate identical or functionally identical elements.

Figure 1:
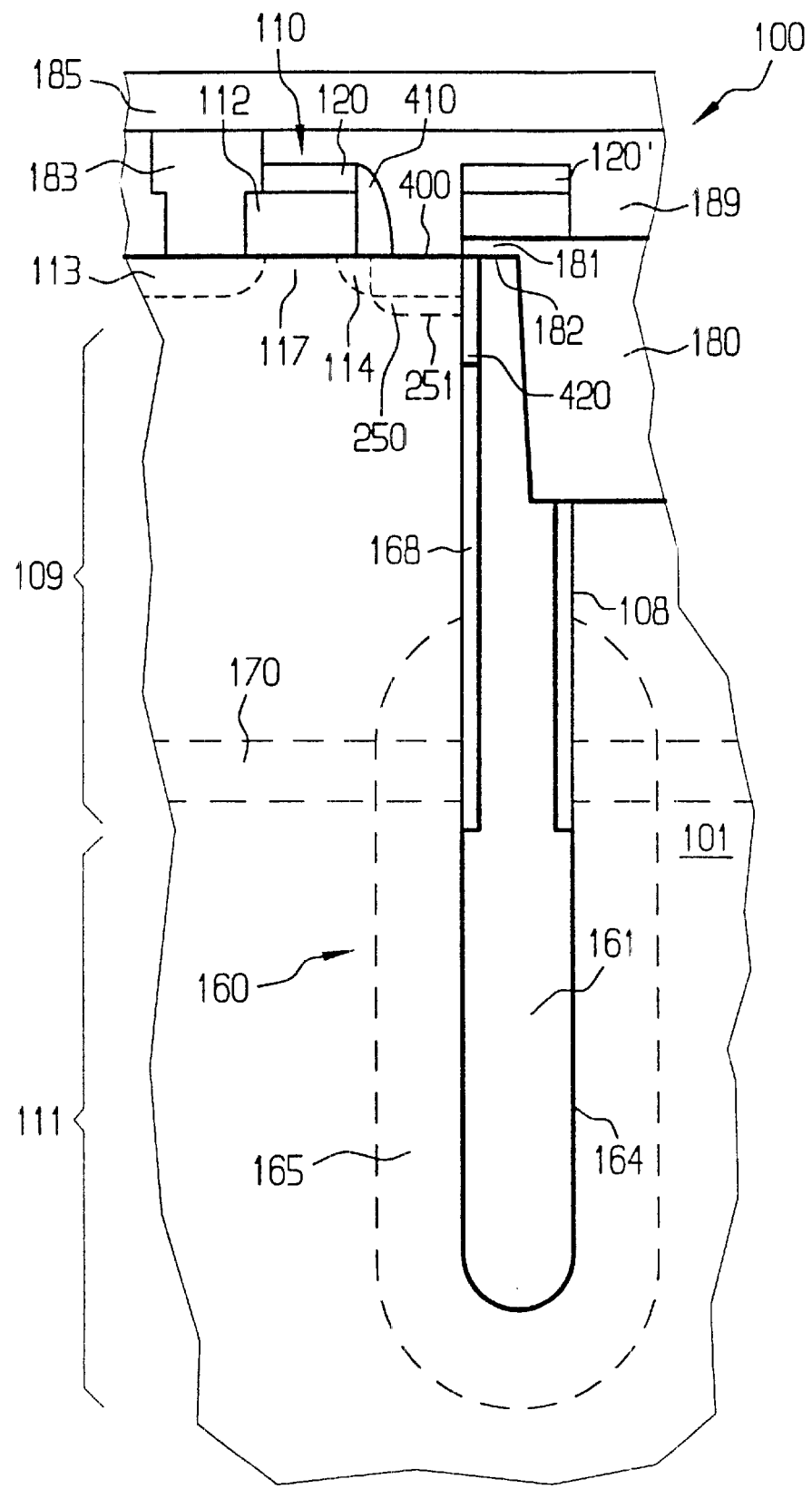
FIG. 1 is a diagrammatic, partial sectional view of an exemplary embodiment of a DRAM memory cell according to the invention corresponding to a first embodiment of the method according to the invention.

Referring now to the figures of the drawings in detail and first, particularly, to FIG. 1 thereof, there is shown a first embodiment of the invention. The memory cell 100 illustrated includes a trench capacitor 160 and a transistor 110. The trench capacitor 160 is formed in a substrate 101. Introduced into the substrate 101 is a buried well 170 which, for example, is formed of a dopant. The trench capacitor 160 has a trench 108 having an upper area 109 and a lower area 111. In the upper area 109 of the trench 108 there is an insulating collar 168. The lower area of the trench extends at least partly through the buried well 170. Provided around the lower area 111 of the trench 108 is a buried plate 165, which forms the outer capacitor electrode. The buried plates 165 of the adjacent memory cells are connected to one another electrically by the buried well 170.

The lower area 111 of the trench 108 and the insulating collar 168 are lined with a dielectric layer 164, which forms the storage dielectric of the trench capacitor. The dielectric layer 164 can be produced from layers or stacks of layers which are formed of oxide, nitride or oxynitride. It is also possible to use memory dielectrics which have a high dielectric constant, such as tantalum oxide, BST (barium strontium titanate), or any other suitable dielectric.

The trench 108 is filled with a conductive trench filling 161, which forms the inner capacitor electrode.

The transistor 110 includes a source region 114 and a drain region 113, which is connected to an edge-free contact 183. In addition, the transistor 110 includes a channel 117 which is controlled by a gate 112. The gate 112 is connected to a word line 120. The edge-free contact 183 is connected to a bit line 185, which runs above a dielectric layer 189.

Above the insulating collar 168, between the substrate 101 and the trench filling 161, there is a conductive contact layer 420, which serves to produce the electrical contact between the source region 114 of the transistor 110 and the conductive trench filling 161. In addition, the conductive contact layer 420 has the task of protecting the transistor 110 against materials of which the trench filling 161 is formed of and which could damage the transistor. These may be, for example, dopants with which the conductive trench filling 161 is doped. During a temperature step, the conductive contact layer 420 prevents outward diffusion of the dopant into the transistor 110.

Above a trench insulator 180, in this variant there runs a passing word line 120', which is insulated from the trench filling 161 by the trench insulator 180. The trench insulator 180 has an insulating area 181 which has a lower edge 182. In one variant of the memory cell 100, there may be a lateral insulating web 410 (spacer) at the gate 112 of the transistor 110.

In the area of the source region 114, underneath a substrate surface 400, there may be a buried contact 250 in a further variant of the memory cell 100. This contact then has a lower limit or lower boundary 251.

Figure 2:
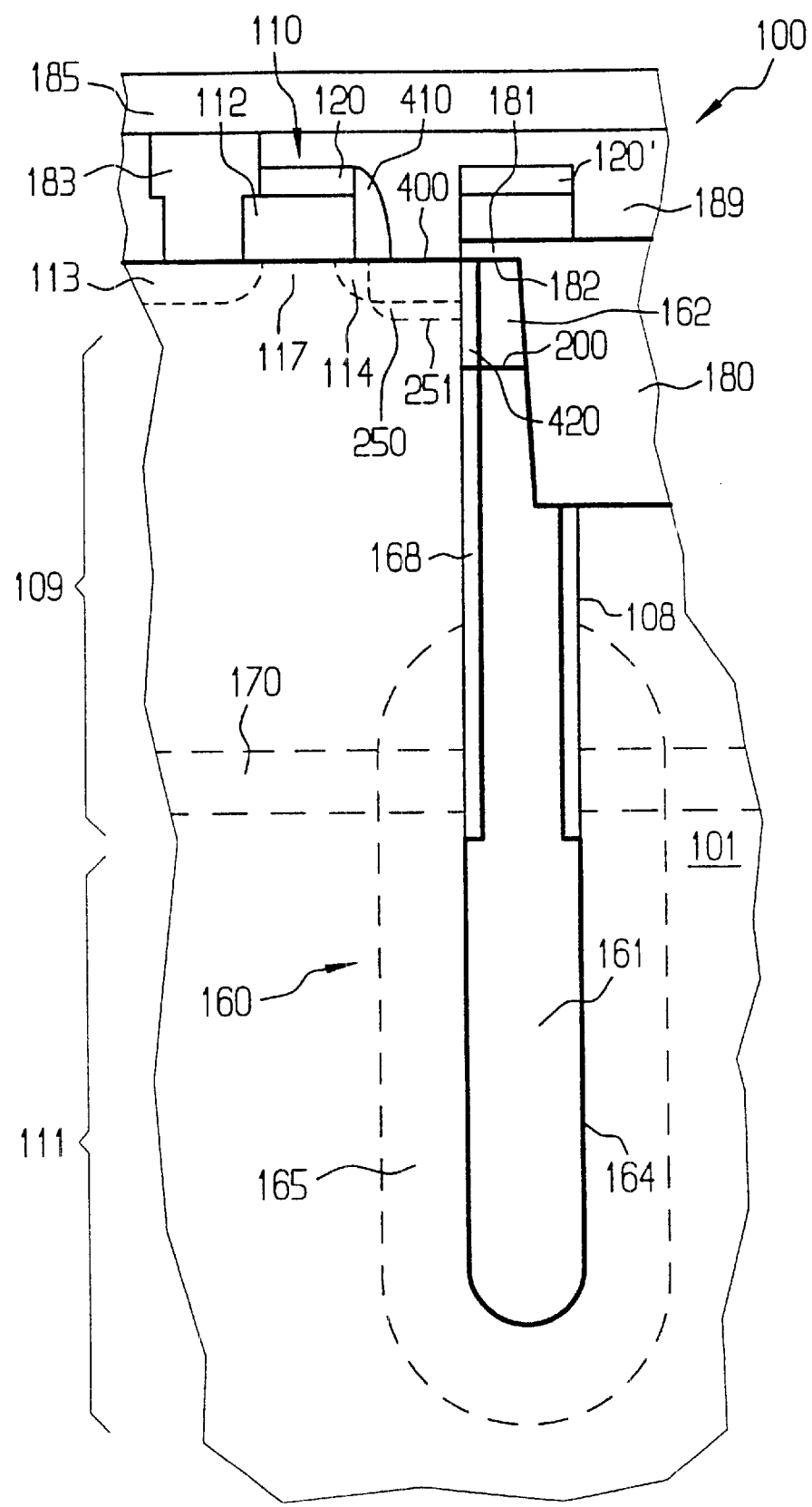
FIG. 2 is a diagrammatic, partial sectional view of a further exemplary embodiment of a DRAM memory cell according to the invention corresponding to a second embodiment of the method according to the invention.

FIG. 2 shows a further embodiment of the trench capacitor 160 according to the invention, which differs from the variant shown in FIG. 1 in that there is a conductive buried bridge 162, which is located above the conductive trench filling 161 and forms an interface 200 between the conductive trench filling 161 and the buried bridge 162.

Figure 3A:
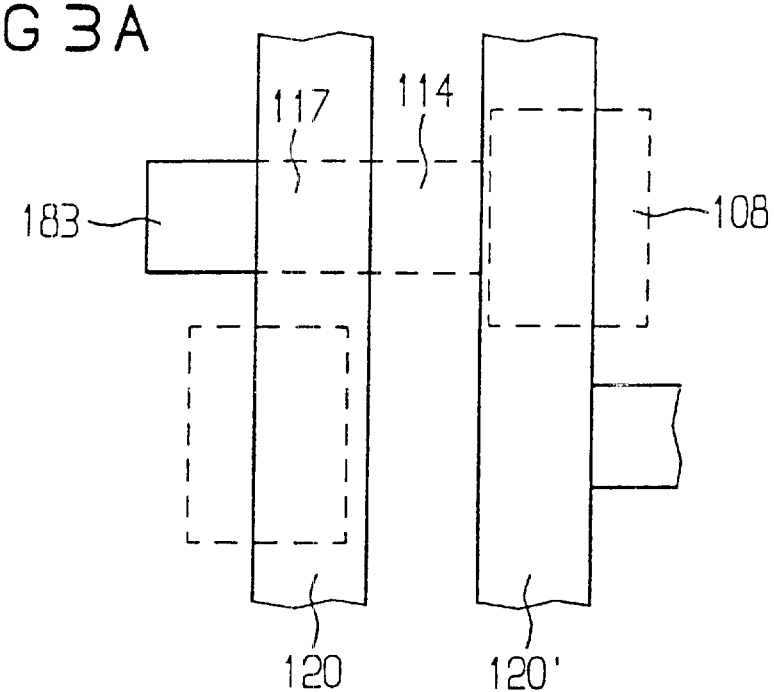
FIG. 3a is a diagrammatic, partial plan view of a conventional configuration of trench capacitor, transistor, bit-line contact, word line, and passing word line.

FIG. 3a shows a plan view of a memory cell 100, which constitutes a conventional DRAM memory cell without the improvements according to the invention. The word line 120 and the passing word line 120' run above the memory cell 100. The edge-free bit-line contact 183 is provided beside the word line 120. The drain region 113 of the transistor 110 is located underneath the edge-free bit-line contact 183. The channel 117 of the transistor 110 is located beside the edge-free bit-line contact 183, underneath the word line 120. The source region 114, which connects the channel 117 to the trench capacitor 160 located in the trench 108, is located beside the channel 117 of the transistor 110. The passing word line 120' runs above the trench 108.

Figure 3B:
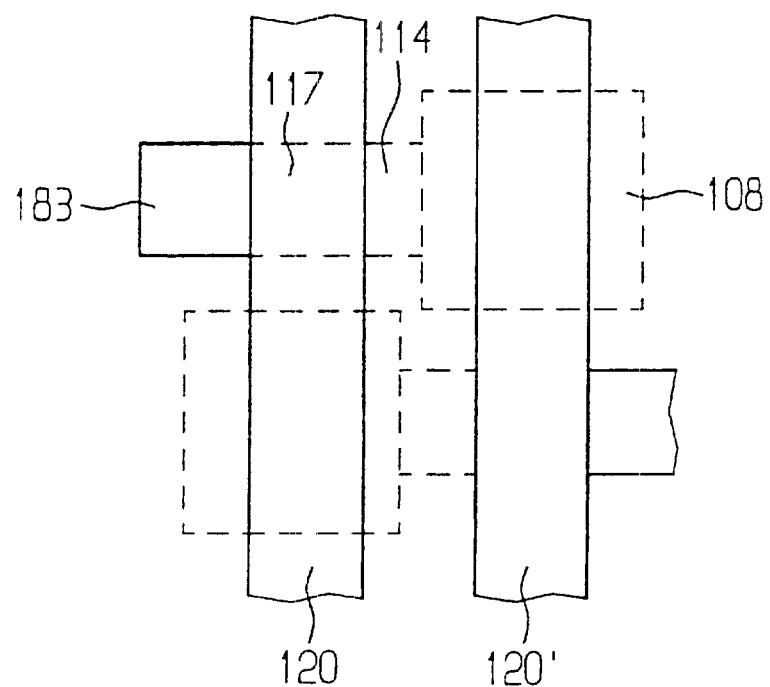
FIG. 3b is a diagrammatic, partial plan view of a configuration of trench capacitor, transistor, bit-line contact, word line, and passing word line, as it is configured in a further exemplary embodiment of a DRAM memory cell according to the invention.
Figure 4A:
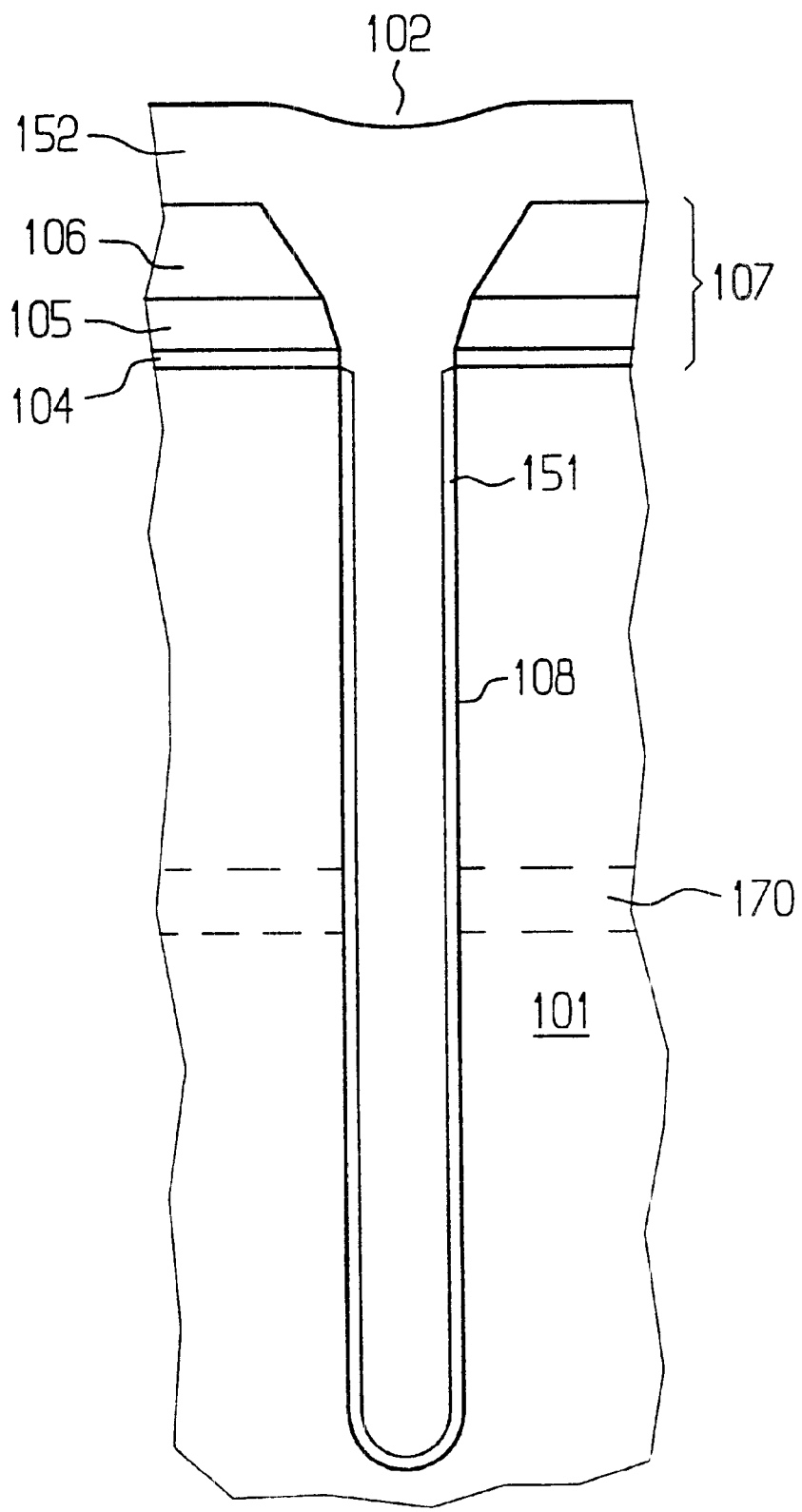

FIG. 3b illustrates the configuration of the memory cell 100 with the trench capacitor 160 according to the invention. The word line 120 and the passing word line 120' run above the memory cell 100. The edge-free bit-line contact 183 is provided beside the word line 120. The drain region 113 of the transistor 110 is located underneath the edge-free bit-line contact 183. The drain region 113 is connected to the channel 117 of the transistor 110, which is located beside the edge-free bit-line contact 183 and underneath the word line 120. The source region 114 of the transistor 110 is located beside the channel 117. The source region 114 is connected on one side to the channel 117 and on the other side to the trench capacitor 160, which is located in the trench 108. The passing word line 120' runs above the trench 108. The enlargement of the trench in comparison to FIG. 3a can be seen clearly in FIG. 3b. The substrate surface used by the trench 108 has been enlarged in the direction of the transistor 110 whilst keeping the area of the memory cell 100 constant. For this purpose, the source region 114 has been reduced in a corresponding way, this being made possible by the conductive contact layer 420, which serves as a barrier. The substrate 101 on which the DRAM memory cell is to be produced is shown in FIG. 4a. In the present variant, the substrate 101 is lightly doped with p-type dopants, such as boron. An n-doped, buried well 170 is formed in the substrate 101 at a suitable depth. For the purpose of doping the buried well 170, phosphorus or arsenic can be used as the dopant. The buried well 170 can be produced, for example, through the use of implantation. It serves to insulate the p-well from the substrate 101 and, in addition, forms a conductive connection between the buried plates 165 of the adjacent trench capacitors. Alternatively, the buried well 170 can be formed by epitaxially grown, doped silicon layers or by a combination of crystal growth (epitaxy) and implantation. This technique is described in U.S. Pat. No. 5,250,829 to Bronner et al.

A substructure stack 107 is formed on the surface of the substrate 101 and includes, for example, a substructure oxide layer 104 and a substructure stop layer 105, which can be used as a polishing stop or etch stop and is formed of nitride, for example. Provided above the substructure stop layer 105 is a hard mask layer 106, which can be formed of tetraethylene orthosilicate (TEOS) or other materials, such as borosilicate glass (BSG). In addition, an antireflection coating (ARC) can be used in order to improve the lithographic resolution.

The hard mask layer 106 is structured by using conventional photolithographic techniques in order to define an area 102, in which the trench 108 is to be formed. The hard mask layer 106 is subsequently used as an etching mask for a reactive ion-etching step (RIE), which forms the deep trench 108.

Formed in the trench 108 is a natural oxide layer 151, which serves as an etch stop in later etching steps. The trench is subsequently filled with an insulating-collar sacrificial layer 152, which ensures adequate temperature stability up to 1100° C. and can be removed selectively with respect to nitride and/or oxide, such as polysilicon, amorphous silicon or other suitable materials. In this process variant, the insulating-collar sacrificial layer 152 is formed of polysilicon.

As FIG. 4b shows, the polysilicon sacrificial layer 152 is removed down to the underside of the insulating collar 168 to be formed. The sacrificial layer 152 can be removed, for example, through the use of planarizing with chemomechanical polishing (CMP) or chemical dry etching (CDE) or selective ion etching. Then, through the use of selective ion etching, the insulating-collar sacrificial layer 152 is sunk into the trench 108. The use of chemical dry etching to sink the polysilicon 152 into the trench 108 is likewise possible.

A dielectric layer is then deposited onto the wafer, covering the substructure stack 107 and the side walls of the trench 108 in the upper area 109 of the latter. The dielectric layer is used to form the insulating collar 168 and, for example, is formed of oxide. The dielectric layer is then etched, for example through the use of reactive ion etching (RIE) or CDE, in order to form the insulating collar 168. The chemical agents for the reactive ion etching are selected such that the oxide is etched selectively with respect to the polysilicon of the insulating-collar sacrificial layer 152 and the nitride of the hard mask layer 106.

With reference to FIG. 4c, the insulating-collar sacrificial layer 152 is removed from the lower area of the trench 108. This is preferably achieved through the use of CDE, the thin natural oxide layer 151 serving as a CDE etch stop.

Alternatively, wet etching can likewise be carried out during the removal of the insulating-collar sacrificial layer 152, for example using KOH or a mixture of HF, $HNO_3$ and $CH_3COOH$. Following the removal of the insulating-collar sacrificial layer 152, the thin natural oxide layer 151 is removed, for example with HF vapor, and a buried plate 165 is formed with n-type dopants, such as arsenic or phosphorus, as the outer capacitor electrode. In this case, the insulating collar 168 serves as a doping mask, which restricts the doping to the lower area 111 of the trench 108. In order to form the buried plate 165, gas-phase doping, plasma doping or plasma-immersion ion implantation (PIII) can be used. These techniques are described, for example, in Ransom et al., J. Electromechanical Soc., Vol. 141, No. 5 (1994), p. 1378 ff.; U.S. Pat. No. 5,344,381 and U.S. Pat. No. 4,937,205. Ion implantation using the insulating collar 168 as a doping mask is also possible. Alternatively, the buried plate 165 can be formed by using a doped silicate glass, such as ASG, as a dopant source. This variant is described, for example, in Becker et al., J. Electrochemical Soc., Vol. 136 (1989), p. 3033 ff. If doped silicate glass is used for doping, it is removed following the formation of the buried plate 165.

Figure 4D:
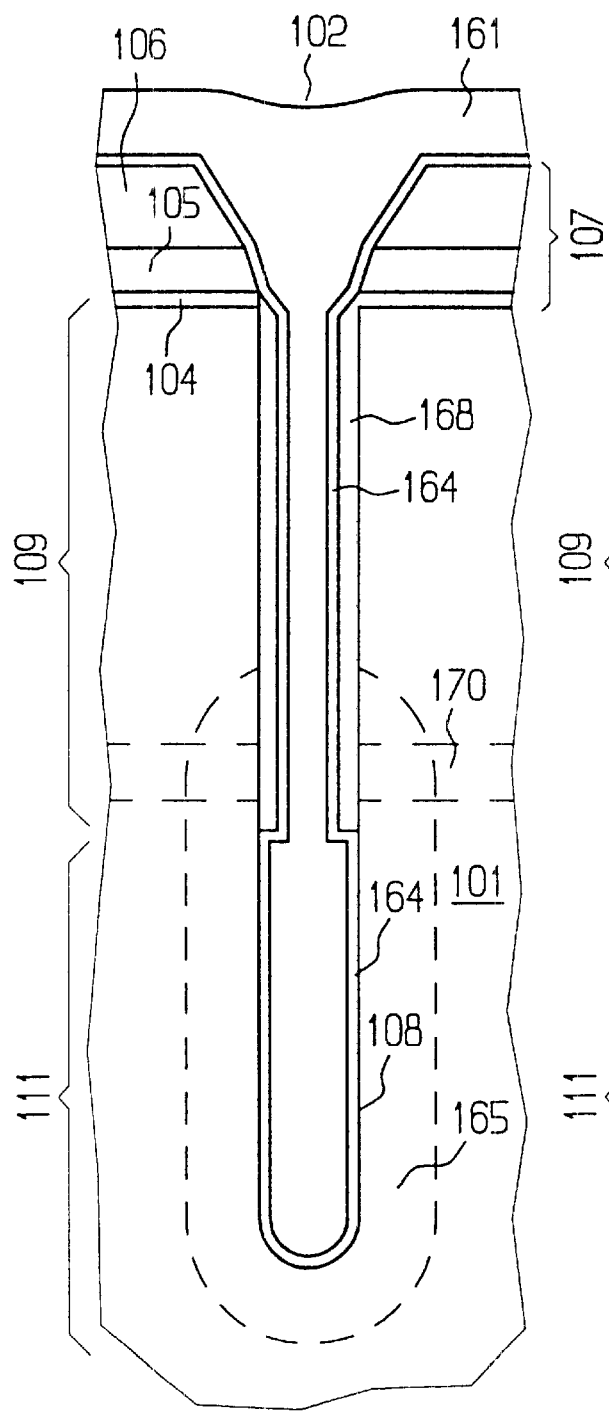

With reference to FIG. 4d, a dielectric layer 164 is formed, which covers the surface of the substructure stack 107 and the interior of the trench 108. The dielectric layer 164 serves as a storage dielectric to separate the capacitor electrodes. In one variant, the dielectric layer 164 is formed of an oxide, a nitride, an oxynitride or a layer stack of oxide and nitride layers. Materials with a high dielectric constant, such as tantalum oxide or titanium oxide, can also be used.

The conductive trench filling 161, which can be formed of doped polysilicon or amorphous silicon, for example, is deposited in order to fill the trench 108 and to cover the substructure stack 107. For this purpose, for example CVD (chemical vapor deposition) or other known process techniques can be used.

Figure 4E:
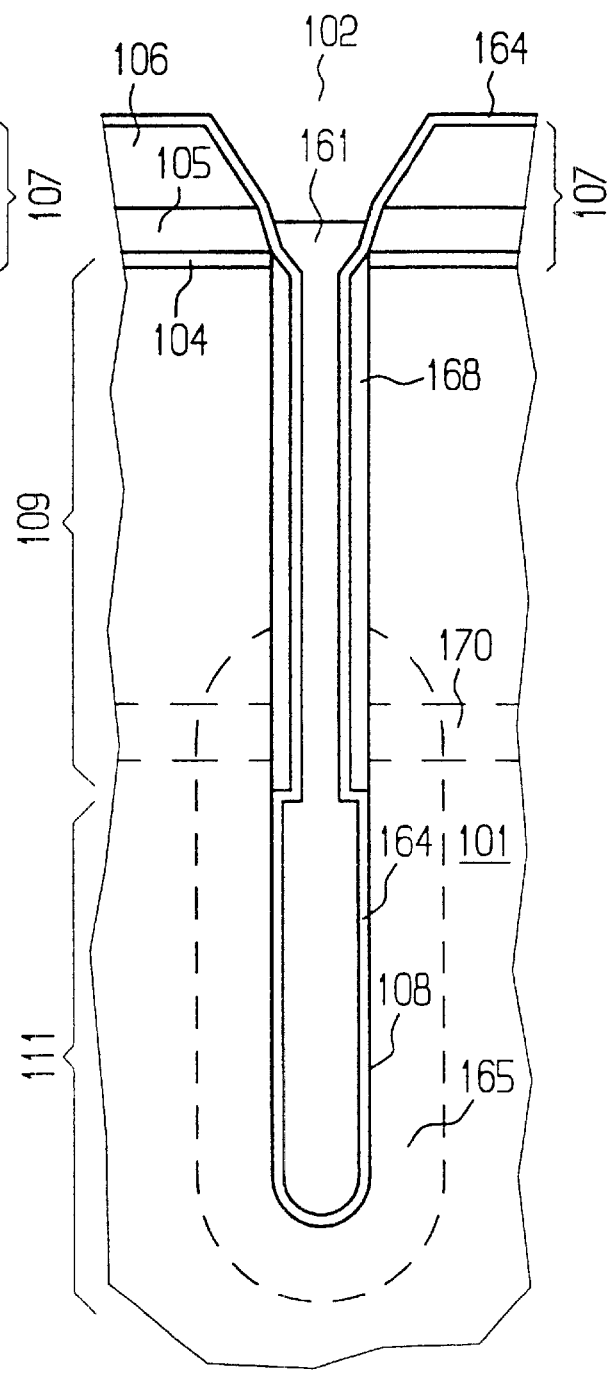

With reference to FIG. 4e, the conductive trench filling 161 is planarized and subsequently sunk, for example in a CDE step, in an RIE step, in a chemical dry etching step or in a combined CMP-RIE step, using suitable chemicals.

According to FIG. 4f, the dielectric layer 164 above the trench filling 161 is removed through the use of suitable etching, which is selective for the trench filling 161. The hard mask layer 106 is likewise removed. The hard mask layer 106 can even be removed at an earlier time in the process sequence, but only after the deep trench 108 has been formed. The insulating collar 168 and the dielectric layer 164 are likewise sunk slightly into the trench 108.

In order to remove the dielectric layer 164 and the hard mask layer 106 above the conductive trench filling 161, it is possible to use both selective dry etching processes which remove the materials one after another and combined dry etching and wet etching processes, in which individual layers, such as the dielectric layer 164 above the trench filling 161, are removed selectively by a wet etching process.

As FIG. 4g shows, the insulating collar 168 and the dielectric layer 164 are then sunk, for example through the use of a CDE step or an RIE step, using suitable chemicals. The action of sinking the insulating collar 168 and the dielectric layer 164, which in this exemplary embodiment are formed of oxide or oxide and nitride, can also be carried out by a wet etching process. The wet etching process removes oxide and nitride selectively in relation to the substrate 101 and the trench filling 161, which in this exemplary embodiment is formed of polysilicon. The conductive contact layer 420, which is formed of a suitable low-resistance material and preferably forms a barrier for materials which are contained in the trench filling 161, is produced by a suitable process. In this exemplary embodiment, the conductive trench filling 161 is formed of highly doped polysilicon. In order to prevent damage to the transistor 110 by dopant which diffuses outward from the conductive trench filling 161, the conductive contact layer 420 is produced from a material which constitutes a diffusion barrier for dopant. In this specific exemplary embodiment, the conductive contact layer 420 is formed of tungsten nitride. The conductive contact layer 420 can be deposited onto the substructure stop layer 105 and into the trench 108 for example by.using a CVD process (Chemical Vapor Deposition). In addition, processes such as LPCVD (Low Pressure CVD), microwave-activated CVD and radiation-activated CVD can be used to deposit the conductive contact layer 420. Sputtering processes and vapor deposition processes are also used in a process variant of the production method according to the invention in order to produce the conductive contact layer 420.

In a subsequent etching step, the conductive contact layer 420 is etched back from the substructure stop layer 105 and planarized, for example in a CDE step, in an RIE step, in a chemical dry etching step or in a combined CMP-RIE step, using suitable chemicals.

Further details of processing steps for producing the memory cell shown in FIG. 1 need not be explicitly described or shown, since they are implemented in accordance with the known prior art. The non-active area of the memory cell is removed and replaced by the trench insulator 180. The photoresist and ARC layers are subsequently removed.

The substructure stop layer 105 is likewise removed, which is done for example by wet chemical etching which is selective with respect to the substructure oxide layer 104.

The substructure oxide layer 104 is removed by wet chemical etching which is selective with respect to silicon.

The method of producing a first variant of the trench capacitor 160 is thus completed, and the following process steps are used to produce the transistor 110 in accordance with the prior art, as described, for example, in U.S. Pat. No. 5,867,420. As an option, the buried contact 250 can be formed by introducing dopant through the substrate surface 400, through the use of vertical or oblique implantation, through the use of plasma doping or through the use of gas phase doping. In this case, it is advantageous that the doping in order to form a low-resistance connection between the drain region 113 and the edge-free contact 183 can be carried out together with the formation of the buried contact 250 and does not need a separate process step.

Figure 5A:
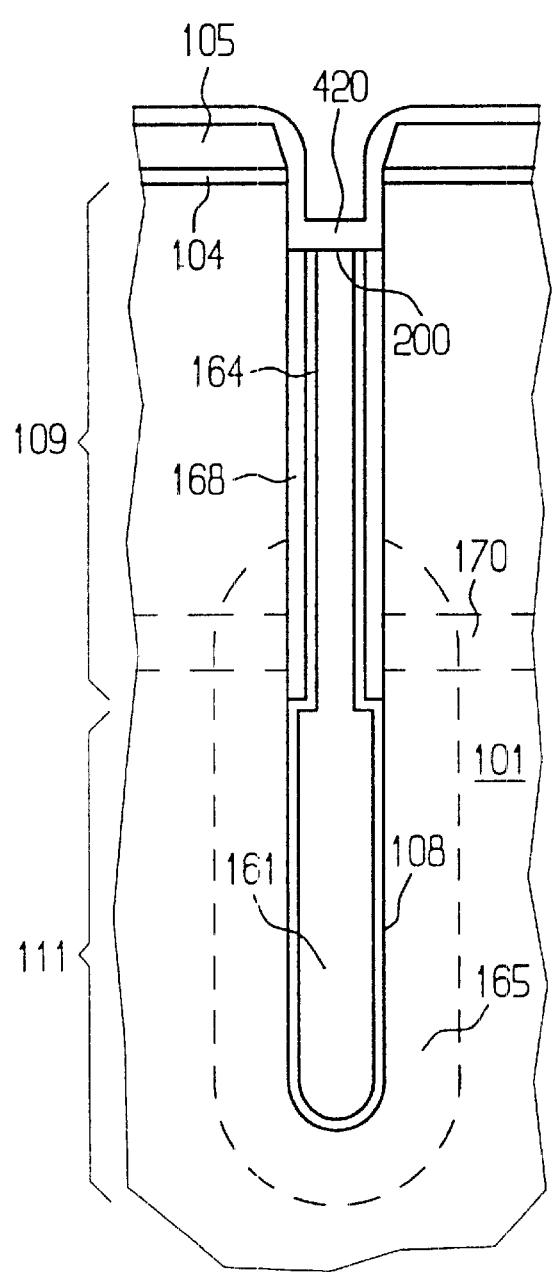
FIGS. 5a and b are diagrammatic, partial sectional views of a further embodiment of a DRAM memory cell configuration according to the invention for producing the DRAM memory cell according to FIG. 2.

FIG. 5a illustrates the production of the variant of the trench capacitor of FIG. 2, which follows the process stage from FIG. 4d. Firstly, the trench filling 161, the dielectric layer 164 and the insulating collar 168 are sunk into the trench 108 at the level of the interface 200. For this purpose, in one process variant, selective etching processes are used which first of all etch back the conductive trench filling 161, then etch back the dielectric layer 164 and finally etch back the insulating collar 168 at the height of the interface 200. Since, in this process variant, the insulating collar 168 and the dielectric layer 168 are formed of oxide or nitrided oxide, these two layers are etched through the use of an etching process. In a different process variant, an anisotropic etching step is used, which removes the conductive trench filling 161, the dielectric layer 164 and the insulating collar 168 in a single step. An RIE etching step can be used for this purpose, in which the hard mask layer 106 serves as an etch mask.

The hard mask layer 106 is then removed and the conductive contact layer 420 is deposited conformally on the substructure stop layer 105 and in the trench 108. The conductive contact layer 420 can be deposited by using the known CVD deposition processes. The conductive contact layer 420 can be produced from conductive materials which serve as a barrier for those materials which are located in the conductive trench filling 161. In the present embodiment of the method according to the invention, the conductive contact layer is formed, for example, of tungsten nitride (WN), titanium nitride (TiN) or tantalum nitride (TaN), which constitute a diffusion barrier for dopants which are contained in the conductive trench filling 161, which is formed of polysilicon.

Figure 5B:
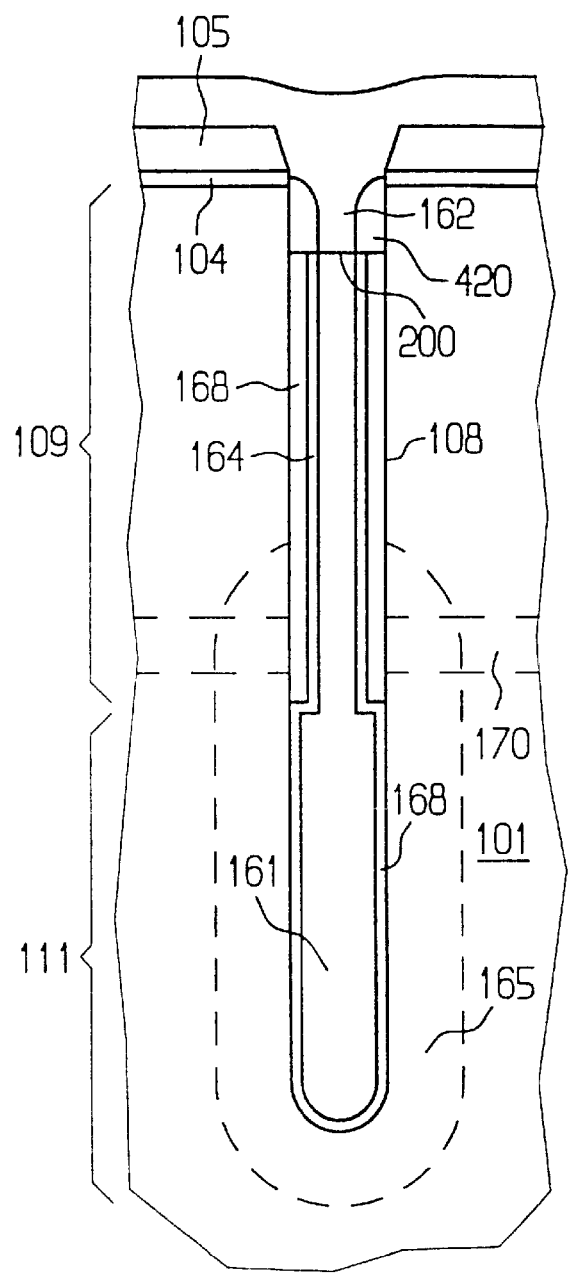

With reference to FIG. 5b, the conductive contact layer 420 is etched back from the substructure stop layer 105 and from the interface 200. This is carried out by using selective etching, which removes the conductive contact layer 420 selectively with respect to the substructure stop layer 105 and the trench filling 161. In this exemplary embodiment, the conductive contact layer 420 is formed of tungsten nitride and is etched through the use of dry etching chemicals containing fluorine, such as tetrafluoromethane or sulfur hexafluoride. Reactive ion etching (RIE), for example, is suitable for this purpose. In one exemplary embodiment, the conductive contact layer 420 is formed of tungsten nitride. For this purpose, selective tungsten deposition is carried out and the deposited tungsten is subsequently nitrided. For the purpose of nitriding, a temperature step in an atmosphere containing nitrogen is carried out, for example.

The conductive buried bridge 162 is then deposited conformally on the substructure stop layer 105 and in the trench 108. The conductive buried bridge 162 is formed of a conductive material which ensures a low-resistance connection between the conductive trench filling 161 and the conductive contact layer 420. For instance, the conductive buried bridge 162 may be formed of metals, suicides, nitrides or silicon. In this specific exemplary embodiment, the conductive buried bridge 162 is produced from highly doped polysilicon.

In a subsequent etching step, the substructure stop layer 105 is removed and, together with the polysilicon which forms the buried bridge 162, is planarized. This can be done, for example, using a CDE step, an RIE step, a chemical dry etching step or with a combined CMP-RIE step, using suitable chemicals. The following processing steps for producing the trench insulator 180 and the transistor 110 are carried out in the way known from the prior art. The non-active area of the memory cell 100 is removed and replaced by the trench insulator 180.

With reference to FIG. 1 and FIG. 2, the conductive contact layer 420 is applied in such a way that it connects the conductive trench filling 161 and the source region 114 of the transistor 110 electrically to each other. In addition, the conductive contact layer 420 is insulated electrically from the passing word line 120' by the trench insulator 180, which has the insulating area 181. Moreover, the electrical connection between the buried contact 250 and the conductive contact layer 420 is ensured by, for example, the lower edge 182 of the insulating area 181 being located above the lower limit 251 of the buried contact 250.

In one process variant, the source region 114 for the electrical connection of the transistor 110 to the conductive contact layer 420 is sufficient, so that no additional buried contact 250 is formed. In this case, it is necessary for the conductive contact layer 420 to produce an electrical contact to the source region 114. In order to achieve this, for example the insulating area 181 can be located with its lower edge 182 at least partly above the source region 114 of the transistor 110.

FIG. 6a illustrates the production of a further variant of the trench capacitor according to FIG. 2, the variant following the process stage of FIG. 5a. A covering layer 430, which is formed of amorphous silicon, for example, is deposited on the barrier layer. In this case, the covering layer has a thickness of 2 to 200 nanometers, preferably 5 to 20 nanometers. Then, a lateral edge web (spacer) is produced from the covering layer 430 and the conductive contact layer 420 by using isotropic etching, which uses the chemical sulfurhexafluoride, for example.

FIG. 6b depicts the result of the spacer etching. The covering layer 430 is then selectively removed. For this purpose, for example a wet chemical etching process using potassium hydroxide (KOH) or ammonium hydroxide (NH$_4$OH) can be used.

Following the removal of the covering layer, a broadened base has been produced at the lower end of the conductive contact layer 420, which, through the use of the additional material, protects the susceptibility to etching of the conductive contact layer 420 in this area.

We claim:

1. A trench capacitor configuration, comprising:
   a substrate formed with a trench;
   said trench having an upper region and a lower region;
   an insulating collar formed in said upper region;
   buried well disposed in said substrate, said lower region at least partly extending through said buried well;
   a buried plate formed around said lower region and serving as an outer capacitor electrode;
   a dielectric layer lining said lower region and said insulating collar, said dielectric layer serving as a capacitor dielectric;
   a conductive trench filling disposed in said trench;
   a conductive contact layer including a metal nitride disposed, between said substrate and said conductive trench filling, in said trench above said insulating collar;
   a conductive buried bridge disposed, above said conductive trench filling, in said trench; and
   said conductive buried bridge providing an electrical contact between said conductive trench filling and said conductive contact layer.

2. A trench capacitor configuration, comprising:
   a substrate formed with a trench, said trench having an upper region and a lower region and defining a side wall in said substrate;
   an insulating collar formed in said upper region;
   a buried well disposed in said substrate, said lower region at least partly extending through said buried well;
   a buried plate formed around said lower region and serving as an outer capacitor electrode;
   a dielectric layer lining said lower region and said insulating collar, said dielectric layer serving as a capacitor dielectric;
   a conductive trench filling disposed in said trench; and
   a conductive-contact layer of tungsten nitride disposed, between said substrate and said conductive trench filling, in said trench above said insulating collar, said conductive contact layer being a buried web provided on said side wall.

3. A trench capacitor configuration, comprising:
   a substrate formed with a trench;
   said trench having an upper region and a lower region;
   an insulating collar formed in said upper region;
   a buried well disposed in said substrate, said lower region at least partly extending through said buried well;
   a buried plate formed around said lower region and serving as an outer capacitor electrode;
   a dielectric layer lining said lower region and said insulating collar, said dielectric layer serving as a capacitor dielectric;
   a conductive trench filling disposed in said trench;
   a conductive contact layer of tungsten nitride disposed, between said substrate and said conductive trench filling, in said trench above said insulating collar;
   a conductive buried bridge disposed, above said conductive trench filling, in said trench; and
   said conductive buried bridge providing an electrical contact between said conductive trench filling and said conductive contact layer.

4. The configuration according to claim 1, including a transistor having a source region disposed adjacent said trench, and said source region extending as far as said conductive contact layer.

5. The configuration according to claim 1, wherein:
   said substrate has a substrate surface; and
   a buried contact is disposed underneath said substrate surface, and said buried contact extends as far as said conductive contact layer.

6. The configuration according to claim 1, including:
   a transistor having a gate with a side wall; and
   a lateral insulating web disposed at said side wall of said gate.

7. The configuration according to claim 1, wherein said conductive trench filling contains a given material, and said conductive contact layer forms a diffusion barrier for said given material in said conductive trench filling.

8. The configuration according to claim 3, wherein said conductive buried bridge contains a given material, and said conductive contact layer forms a diffusion barrier for said given material in said conductive buried bridge.

9. The configuration according to claim 1, wherein said conductive contact layer includes titanium nitride.

10. The configuration according to claim 1, wherein said conductive contact layer includes tantalum nitride.

11. The configuration according to claim 4, wherein said conductive contact layer forms an electrically conductive connection between said source region and said conductive trench filling.

12. The configuration according to claim 4, including:
a conductive buried bridge disposed, above said conductive trench filling, in said trench; and
said conductive contact layer providing an electrical contact between said source region and said conductive buried bridge.

13. The configuration according to claim 5, wherein said conductive contact layer forms an electrically conductive connection between said buried contact and said conductive trench filling.

14. The configuration according to claim 5, including:
a conductive buried bridge disposed, above said conductive trench filling, in said trench; and
said conductive contact layer providing an electrical contact between said buried contact and said conductive buried bridge.

15. The configuration according to claim 1, including a trench insulator having an insulating region at least partly covering said trench.

16. The configuration according to claim 15, wherein:
said buried contact has a lower boundary and extends as far as said conductive contact layer; and.
said insulating region has a lower edge disposed above said lower boundary of said buried contact.

17. The configuration according to claim 1, wherein said conductive contact layer includes at least one material selected from the group consisting of tungsten nitride, titanium nitride and tantalum nitride.

18. The configuration according to claim 1, wherein:
said trench defines a sidewall in said substrate;
said conductive contact layer is disposed on said sidewall of said trench; and
said conductive contact layer has a common surface with said conductive buried bridge.

* * * * *

UNITED STATES PATENT AND TRADEMARK OFFICE
CERTIFICATE OF CORRECTION

PATENT NO.    : 6,548,850 B1
DATED         : April 15, 2003
INVENTOR(S)   : Stefan Gernhardt et al.

It is certified that error appears in the above-identified patent and that said Letters Patent is hereby corrected as shown below:

<u>Title page,</u>
Item [30], should read as follows:
-- Sep. 29, 1999        (DE)        199 46 719.6 --
Item [75], should read as follows:
-- Stefan Gernhardt, Mechanicsville, VA (US);
Martin Schrems, Langebrück (DE);
Klaus-Dieter Morhard, Dresden (DE) --

Signed and Sealed this

Nineteenth Day of August, 2003

JAMES E. ROGAN
*Director of the United States Patent and Trademark Office*